(12) United States Patent
Choi et al.

(10) Patent No.: US 8,915,151 B2
(45) Date of Patent: Dec. 23, 2014

(54) ACTIVE SKIN FOR CONFORMABLE TACTILE INTERFACE

(75) Inventors: Hyouk-Ryeol Choi, Gyeonggi-do (KR); Hyung-Pil Moon, Gyeonggi-do (KR); Ja-Choon Koo, Seoul (KR); Se-Gon Roh, Gyeonggi-do (KR)

(73) Assignee: Sungkyunkwan University Foundation for Corporate Collaboration, Gyeonggi-do (KR)

( * ) Notice: Subject to any disclaimer, the term of this patent is extended or adjusted under 35 U.S.C. 154(b) by 1114 days.

(21) Appl. No.: 12/791,230

(22) Filed: Jun. 1, 2010

(65) Prior Publication Data

US 2010/0307900 A1   Dec. 9, 2010

(30) Foreign Application Priority Data

Jun. 5, 2009   (KR) .................. 10-2009-0049756
May 4, 2010   (KR) .................. 10-2010-0041800

(51) Int. Cl.
  *G01L 1/26*   (2006.01)
  *G01L 5/04*   (2006.01)
  *H01H 13/85*   (2006.01)
  *H03K 17/96*   (2006.01)

(52) U.S. Cl.
  CPC .............. *H01H 13/85* (2013.01); *H03K 17/962* (2013.01); *H01H 2201/018* (2013.01); *H01H 2215/05* (2013.01); *H01H 2239/006* (2013.01); *H03K 2217/96062* (2013.01)
  USPC .................. 73/862.391; 200/330; 73/862.381; 73/818; 73/819

(58) Field of Classification Search
  CPC ............ H01H 13/85; H01H 2201/018; H01H 2239/006; H01H 2215/05; H03K 17/962; H03K 2217/96062
  USPC ............... 73/862.391, 862.381, 818; 200/330
  See application file for complete search history.

(56) References Cited

U.S. PATENT DOCUMENTS 4,492,949 A * 1/1985 Peterson et al. ............... 338/114
4,640,137 A * 2/1987 Trull et al. ............... 73/862.046

(Continued)

FOREIGN PATENT DOCUMENTS

| JP | 2009041463 A | * | 2/2009 |
| KR | 20050091880 A | | 9/2005 |
| KR | 20090029091 A | | 3/2009 |

OTHER PUBLICATIONS

English Machine Translation of KR20090029010, Bu et al.*

(Continued)

*Primary Examiner* — Lisa Caputo
*Assistant Examiner* — Philip Cotey
(74) *Attorney, Agent, or Firm* — Dority & Manning, P.A.

(57) ABSTRACT

Disclosed is an active skin including: a tactile sensor substrate which includes a first film including a dielectric elastic material and formed with a plurality of sensing points, and a pair of first electrodes respectively formed on upper and lower sides of the sensing point; a tactile actuator substrate which includes a second film including a dielectric elastic material and formed with a plurality of actuating points, and a pair of second electrodes respectively formed on upper and lower sides of the actuating point; and an insulating layer which is interposed between the tactile sensor substrate and the tactile actuator substrate and couples the tactile sensor substrate and the tactile actuator substrate. With this, a tactile sensor and a tactile actuator are integrated, so that there is provided an interactive tactile interface to not only feel like a human's skin but also actively move like a muscle.

13 Claims, 7 Drawing Sheets

(56) References Cited

U.S. PATENT DOCUMENTS

| | | | |
|---|---|---|---|
| 5,060,527 A * | 10/1991 | Burgess | 73/862.68 |
| 6,072,130 A * | 6/2000 | Burgess | 200/86 R |
| 7,481,120 B2 * | 1/2009 | Gravesen et al. | 73/862.042 |
| 7,685,886 B2 * | 3/2010 | Sano et al. | 73/849 |
| 8,581,866 B2 * | 11/2013 | Park et al. | 345/173 |
| 2004/0124738 A1 * | 7/2004 | Pelrine et al. | 310/307 |
| 2006/0164254 A1 * | 7/2006 | Kamizono et al. | 340/667 |
| 2007/0180924 A1 * | 8/2007 | Warren et al. | 73/780 |
| 2009/0001855 A1 * | 1/2009 | Lipton et al. | 345/156 |
| 2009/0015270 A1 * | 1/2009 | Hayakawa et al. | 324/686 |
| 2009/0031825 A1 * | 2/2009 | Kishida et al. | 73/862.621 |
| 2009/0109716 A1 * | 4/2009 | Sadwick et al. | 363/126 |
| 2009/0133508 A1 * | 5/2009 | Johansson et al. | 73/862.046 |
| 2009/0151478 A1 * | 6/2009 | Shimomoto et al. | 73/862.626 |
| 2009/0154053 A1 * | 6/2009 | Biggs et al. | 361/272 |
| 2009/0165569 A1 * | 7/2009 | Taya et al. | 73/862.041 |
| 2009/0189873 A1 * | 7/2009 | Peterson et al. | 345/173 |
| 2009/0235721 A1 * | 9/2009 | Robinson et al. | 73/31.05 |
| 2010/0033196 A1 * | 2/2010 | Hayakawa et al. | 324/686 |
| 2010/0109486 A1 * | 5/2010 | Polyakov et al. | 310/365 |
| 2010/0164324 A1 * | 7/2010 | Kim et al. | 310/318 |

OTHER PUBLICATIONS

English Machine Translation of JP2009014463, Tamura et al.*
High-Speed Electrically Actuated Elastomers with Strain Greater Than 100%, Pelrine et al., Feb. 4, 2000, Science, vol. 287 p. 836.*

* cited by examiner (a)  (b)

ACTIVE SKIN FOR CONFORMABLE TACTILE INTERFACE

CROSS-REFERENCE TO RELATED APPLICATION

This application claims priority to and the benefit of Korean Patent Application No. 10-2009-0049756 filed in the Korean Intellectual Property Office on Jun. 5, 2009 and Korean Patent Application No. 10-2010-0041800 filed in the Korean Intellectual Property Office on Mar. 4, 2010, the entire contents of which are incorporated herein by reference.

BACKGROUND OF THE INVENTION (a) Field of the Invention

The present invention relates to technology for achieving an interactive tactile interface as a tactile sensor and a tactile actuator are integrated to not only feel like a human's skin but also actively move like a muscle.

(b) Description of the Related Art

Haptics derived from the word 'haptic,' which means 'touch' in Greek, refers to study of technology for transferring force and haptic information to control a remote robot, an object under a virtual environment, or the like to a user. The haptics includes two core technologies of kinesthetic feel and tactile perception, in which the kinesthetic feel refers to technology related to transfer of large-scale force like muscular power, and the tactile perception refers to technology related to transfer of tactual perception of fine touch or pressure variation felt on a skin.

Most early study of a haptic interface has been focused on force-feedback technology related to the transfer of the kinesthetic feel, which reaches a level so high that many devices based on the haptic interface has hitherto been commercialized.

Particularly, tactile sensing and tactile display technologies are collectively called a tactile interface technology. The tactile sensing technology has relatively rapidly reached a stage of commercialization, and recently extended applications to an applied to a small mobile device represented by Apple's iPhone, Samsung Electronics' Haptic phone, etc. On the other hand, the tactile display is still in an early stage and applied to limited use such as a mouse, a dynamic Braille display for visual impaired people, etc.

The reason why the study of the tactile interface technology is important is because the tactile interface technology can be used as one fact that makes a remote environment or virtual reality be realistic together with other senses since a person's process of receiving information is determined by not only one sense but multi-modal interaction, and the tactile interface technology can make the tactile sensation of itself be plentiful in addition to the existing sensation expression. Accordingly, there is increased need of applying the tactile interface technology to a game employing the tactile sensation, a driving or flight simulator having a reaction, a medical simulator for operating or palpating a virtual patient, a patient's rehabilitation orthotic device voluntarily changeable in various physical properties, etc.

Meanwhile, the most important technical problem that should be solved to commercialize the tactile interface technology is in providing an actuating system for giving tactile stimulation. In other words, a plurality of actuators has to be integrated in a small space by miniaturizing the actuating system. However, conventional actuating systems have problems in that their structures are very hard, the whole system including the actuator, power and control circuits is generally large in comparison with the performance of the actuator, the driving speed is relatively slow, the design mechanism is complicated, and many steps are required for the fabricating process.

In particular, that the actuator is hard is the most disadvantageous to the tactile interface technology which is available only when conformable to a human's skin or various opposite objects' surfaces. The tactile interface essentially needs conformability to be embedded in the surfaces of various portable devices, robots or the like, but it is difficult to find the conformability in the technology of the actuators hitherto proposed. This is one of the most serious technical problems the tactile interface technology has.

Further, the complicated fabricating processes have the largest effect on the price of products, and thus may become another obstacle to the application of the tactile technology in the future. Thus, it is necessary for planning and designing a device by taking the price competitiveness of the fabricating process into account for commercialization in the future.

Additionally, integration between a tactile sensor vital to the tactile interface and the tactile display is an important technical problem that has to be solved in the future for developing a new interface technology. Most of the existing pin-array type tactile displays provide just a basic texture by forming a simple texture pattern, and it is difficult to find a device capable of providing active feedback based on combination of the tactile sensor and the actuator. Thus, it is important to develop a device where the tactile sensor and the actuator are combined so as to achieve a new type tactile interface that enables "Response by Touch."

SUMMARY OF THE INVENTION

Accordingly, the present invention is conceived to solve the foregoing problems, and an aspect of the present invention is to provide technology for achieving an interactive tactile interface as a tactile sensor and a tactile actuator are integrated to not only feel like a human's skin but also actively move like a muscle, thereby completing an interface of input and output through only "Response by Touch."

Another aspect of the present invention is to provide technology of an interactive tactile interface which not only has conformability applicable to a human's skin or various opposite objects' surfaces, but is also easy to simplify its fabricating process and to enlarge the interface, thereby enhancing practicality.

An exemplary embodiment of the present invention provides an active skin including: a tactile sensor substrate which includes a first film including a dielectric elastic material and formed with a plurality of sensing points, and a pair of first electrodes respectively formed on upper and lower sides of the sensing point; a tactile actuator substrate which includes a second film including a dielectric elastic material and formed with a plurality of actuating points, and a pair of second electrodes respectively formed on upper and lower sides of the actuating point; and an insulating layer which is interposed between the tactile sensor substrate and the tactile actuator substrate and couples the tactile sensor substrate and the tactile actuator substrate.

The sensing point may include a sensing embossment protruding upwardly on the tactile sensor substrate, and the actuating point may include an actuating embossment protruding upwardly on the tactile actuator substrate.

If both the sensing point and the actuating point have the embossed pattern protruding upwardly on the respective substrates, the sensing embossment and the actuating embossment may be arranged to overlap each other leaving the insulating the insulating layer therebetween.

The dielectric elastic material of the first film or the second film may include at least one selected from a group consisting of silicon, fluorine elastomer, polyurethane and isoprene.

The first electrode or the second electrode may include a flexible electrode including at least one selected from a group consisting of carbon, graphite or conductive polymer.

The first electrode or the second electrode may include a transparent material.

The first electrode or the second electrode may include graphene.

The insulating layer may include a transparent material such as polyurethane.

At least one of two exposed external surfaces of the tactile sensor substrate and the tactile actuator substrate may be provided with a protecting film.

The active skin may further include a tactile sensing circuit electrically connected to the pair of first electrodes respectively formed on upper and lower sides of the sensing point of the tactile sensor substrate, and a tactile actuating circuit electrically connected to the pair of second electrodes respectively formed on upper and lower sides of the actuating point of the tactile actuator substrate.

The tactile sensing circuit may include a voltmeter connected to the first electrode of the sensing point, an analog-digital converter (ADC) converting a voltage of the first electrode measured by the voltmeter into a digital signal, and a computer interfacing with the ADC.

The tactile actuating circuit may include a controller receiving a command from a computer, a high voltage amplifier controlled by the controller driven in response to the command from the computer, a switching circuit outputting a pulse width modulation (PWM) signal by switching a high voltage output from the high voltage amplifier, first/second switching devices branched from the switching circuit and respectively receiving the PWM signal, and first/second opto-couplers respectively connected to the first/second switching devices, in which a driving voltage is applied to opposite ends of the first/second opto-coupler and the second electrode of each actuating point is connected to the opposite ends of the second opto-coupler.

Each of the first/second switching devices may include a metal oxide semiconductor field effect transistor.

DETAILED DESCRIPTION OF THE EMBODIMENTS

Hereinafter, an interactive tactile interface technology according to an exemplary embodiment of the present invention will be called an active skin. In other words, the feature of the present invention is direct to the technology of an interactive tactile interface in which a tactile sensor and a tactile actuator are integrated to not only feel like a human's skin but also actively move like a muscle, and thus the active skin may be a term of implicatively representing this technical feature.

Figure 1:
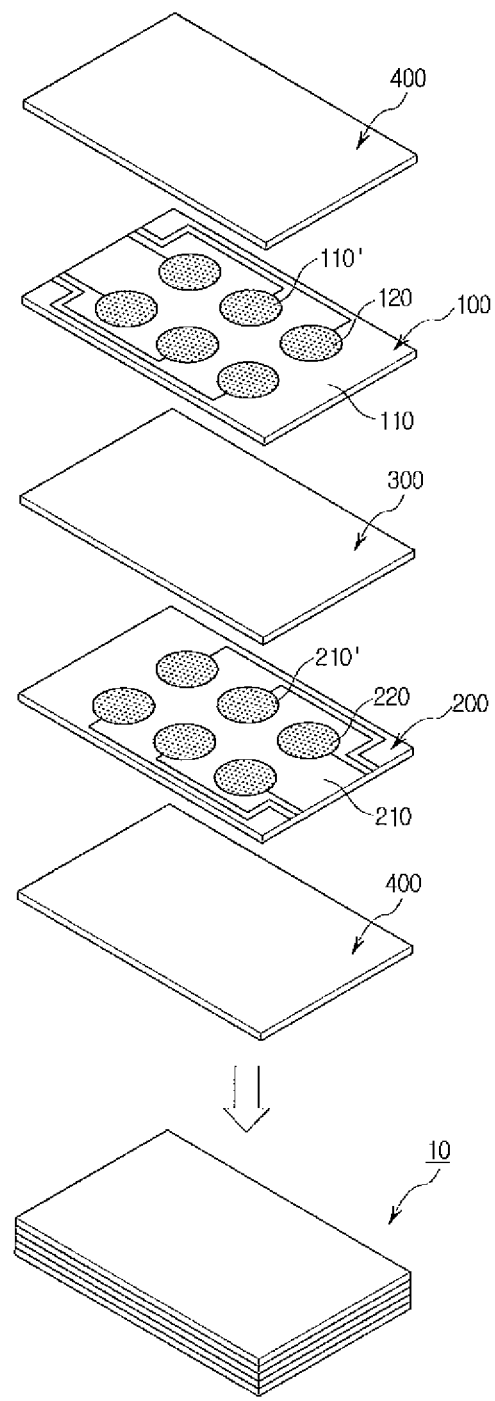
FIG. 1 is an exploded perspective view of an active skin according to an exemplary embodiment of the present invention.

As shown in FIG. 1, an active skin 10 according to an exemplary embodiment of the present invention includes a tactile sensor substrate 100, a tactile actuator substrate 200, and an insulating layer 300.

The tactile sensor substrate 100 includes a first film 110 made of a dielectric elastic material and formed with a plurality of sensing points 110', and a pair of first electrodes 120 respectively formed on both upper and lower sides of the sensing points 110'. With this configuration, the sensing point 110' of the tactile sensor substrate 100 may be a kind of capacitor. In other words, since the first electrodes 120 are formed on both sides of the first film 110 made of the dielectric elastic material functioning as an insulator, electric charges are accumulated in the first film 110 when an electric current is applied between the first electrodes 120, so that the structure of the sensing point 110' can serve as a capacitor.

Figure 2:
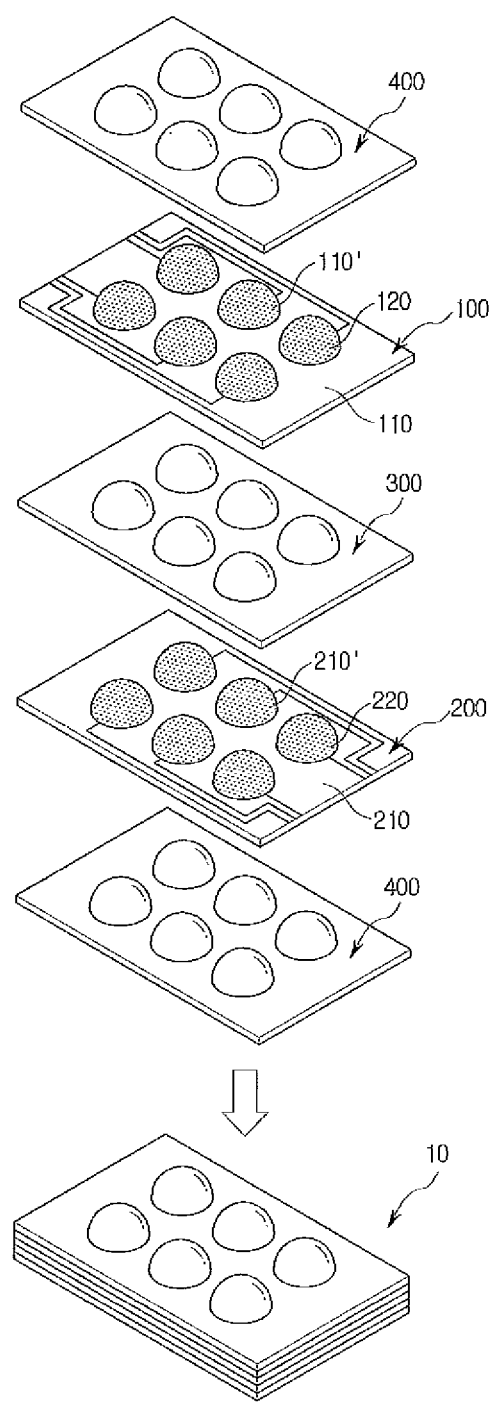
FIG. 2 is an exploded perspective view of an active skin according to another exemplary embodiment of the present invention.
Figure 3:
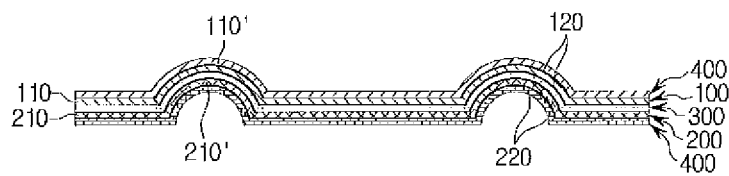
FIG. 3 is a sectional view of the active skin in FIG. 2.

Particularly, in this embodiment, as shown in FIGS. 2 and 3, the sensing point 110' may have an embossed pattern protruding upwardly from the tactile sensor substrate 100, but the shape of the sensing point 110' is not limited to such an embossed structure. However, the embossed pattern is advantageous in that a user can more easily recognize the existence of the sensing point 110' formed on the tactile sensor substrate 100 through a tactile sensation. Hereinafter, the sensing point 110' will be called a sensing embossment 110' in light of having the embossed pattern.

Figure 4:
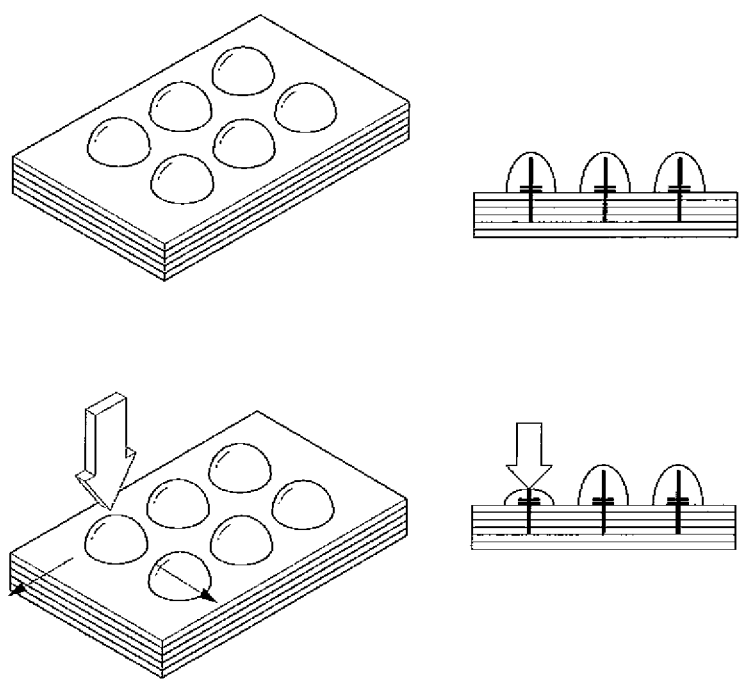
FIG. 4 is a schematic view for explaining a driving principle of a tactile sensor substrate constituting an exemplary embodiment of the present invention.

FIG. 4 is a view for explaining a principle that the tactile sensor substrate 100 can be used as a tactile sensor. As shown in FIG. 4, if the sensing embossment 110' protruding on the tactile sensor substrate 100 is changed in a shape by external force, it leads to a change in the thickness and superficial area of the sensing embossment 110'. As well known, the capacitance of the capacitor is inversely proportional to the distance between two electrodes but is proportional to the area of two electrodes, so that the transformation of the sensing embossment 110' causes the capacitance to change. Hence, it is possible to sense the presence and strength of the external force by measuring the change in the capacitance of the sensing embossment 110', which means that the tactile sensor substrate 100 in this embodiment can serve as a tactile sensor.

The first electrodes 120 forming a pair are provided on both upper and lower sides of each of the plural sensing points 110' formed on the tactile sensor substrate 100 in this embodiment. That is, one sensing point 110' functions as one capacitor. Thus, it is possible to control the sensibility of the tactile sensor by adjusting the density of the sensing points 110'.

Figure 6:
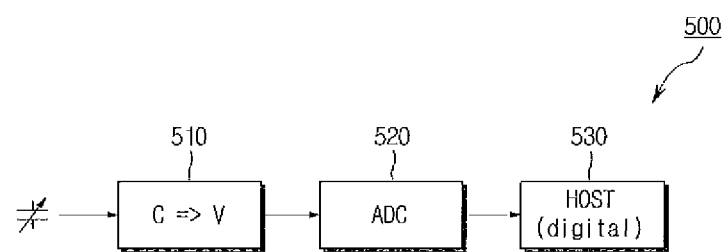
FIG. 6 is a schematic block diagram of a tactile sensing circuit according to an exemplary embodiment of the present invention.

FIG. 6 schematically shows a configuration of a tactile sensing circuit 500 connected to the first electrode 120 of the sensing point 110' formed on the tactile sensor substrate 100. If the capacitance of the sensing point 110' is changed by external force applied thereto, it leads to a change of voltage. Thus, it is possible to estimate a change of capacitance indirectly by measuring the change of voltage through a voltmeter 510. Such a change of voltage is converted into a digital signal through an analog-digital converter (ADC) 520, and the digital signal is input and output through an interface of a computer 530.

Here, an important feature of the tactile sensor substrate 100 according to an exemplary embodiment is that a flexible material can be used for all elements constituting the tactile sensor substrate 100. That is, the dielectric elastic material of the first film 110 may include at least one selected from a group consisting of silicon, fluorine elastomer, polyurethane and isoprene. Also, the pair of first electrodes 120 formed on both sides of the sensing embossment 110' may be provided as a flexible electrode not to disturb movement of the sensing embossment 110'. For example, the first electrodes 120 may be formed by spraying power solution containing carbon, graphite, conductive polymer or the like material. Accordingly, the conformability of the tactile sensor substrate is advantageous to be conformable to and in close contact with a human's skin or various opposite objects' surfaces.

Further, since the fundamental structure of the tactile sensor substrate 100 is based on the first film 110 made of the dielectric elastic material, it is advantageous to not only make a large-sized tactile sensor substrate 100 easily but also complete the tactile sensor substrate 100 by a simple process of forming the sensing embossment 110' on the first film 110 and printing the first electrodes 120 on both sides of the first film 110.

Meanwhile, the pair of first electrodes 120 formed on both sides of the sensing embossment 110' may be made of a flexible and transparent material. For the flexible and transparent material, graphene may be selected as a polycyclic aromatic molecule where plural carbon atoms are covalently bonded. In the grapheme, the covalently bonded carbon atoms forms a six-member ring as a basic repetitive unit, but may alternatively include a five-member ring and/or a seven-member ring. Such grapheme is a material of which the carbon atoms are connected each other to have a honeycomb planar structure, and is not only structurally and chemically stable but also excellent in flexibility and electric properties. Hence, if the first electrode 120 including the graphene excellent in the flexibility is used, it is possible to be in close contact with an irregular shape. Further, since the color of the first film 110 can be seen through the transparent first electrode 120, it is possible to make the tactile sensor substrate 100 have color similar to that of a human's skin.

Meanwhile, the tactile actuator substrate 200 includes a second film 210 made of a dielectric elastic material and formed with a plurality of actuating points 210', and a pair of second electrodes 120 respectively formed on both upper and lower sides of the actuating point 210'. The tactile actuating substrate 200 has approximately the same fundamental structure as the tactile sensor substrate 100. In an exemplary embodiment of the present invention, the actuating point 210' can have an embossed pattern protruding upwardly from the tactile actuator substrate 200 like the sensing point 110' of the tactile sensor substrate 100, but different in a driving principle from that of the tactile sensor substrate 100.

The driving principle of the tactile actuator substrate 200 is a kind of field-induced transformation using pressure due to electrostatic force, called Maxwell stress. That is, when voltage is applied to the second electrodes 220 formed on both sides of the second film 210, the second film 210 made of dielectric elastic material is contracted to decrease in the thickness but increase in the area. The properties that the dielectric elastic film is contracted in a field direction by the pressure due to the electrostatic force can be referred to Korean Patent First Publication No. 2005-91880 applied by the present inventor.

Also, the shape of the actuating point 210' is not limited to the embossed structure. Hereinafter, the actuating point 210' will be called an actuating embossment 210' in light of having the embossed pattern.

Figure 5:
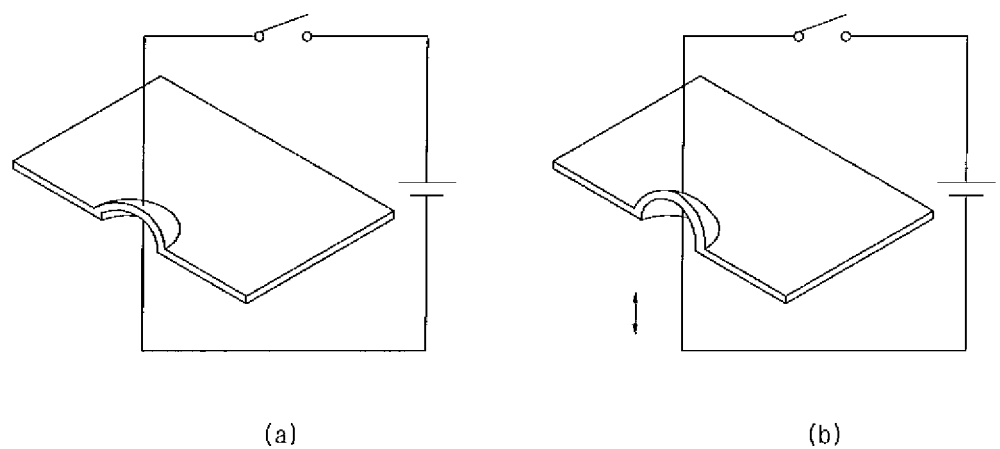
FIG. 5 is a schematic view for explaining a driving principle of a tactile actuator substrate constituting an exemplary embodiment of the present invention.

FIG. 5 is a view for explaining an operating principle of the tactile actuator substrate 200. Particularly, if the actuating point 210' is shaped to have the embossed structure, it is desired in that not only the tactile actuating substrate 200 can be fabricated by the same process as the tactile sensor substrate 100 but also the contraction of the second film 210 due to the field-induced transformation can be more easily achieved by the driving mechanism of the actuator. As shown in FIG. 5, if voltage is applied to the pair of second electrodes 220 formed on both upper and lower sides of the actuating embossment 210' protruding on the second film 210 made of the dielectric elastic material, the actuating embossment 210' is transformed to be more embossed than that before receiving the voltage. The reason is because the initial shape of the actuating embossment 210' is embossed like a convex hemisphere and thus the area increased by the thickness-directional contraction of the second film 210 due to applying of the voltage causes the actuating embossment 210' to be embossed outwardly. Accordingly, if a tactile organ of a human is being in contact with the actuating embossment 210' on the tactile actuator substrate 200, the expansion of the actuating embossment 210 can give tactility to the tactile organ. This means that the tactile actuator substrate 200 in this exemplary embodiment can perform a tactility display function corresponding to an output of an interactive tactile interface.

Here, the second electrodes 220 forming a pair are provided on both upper and lower sides of each of the plural actuating points 210' formed on the tactile actuator substrate 200 in this exemplary embodiment. That is, one actuating point 210' can perform an independent tactile display function. Thus, a stimulus higher than a threshold required by each tactile organ can be given by adjusting the density of the actuating point 210'.

Figure 7:
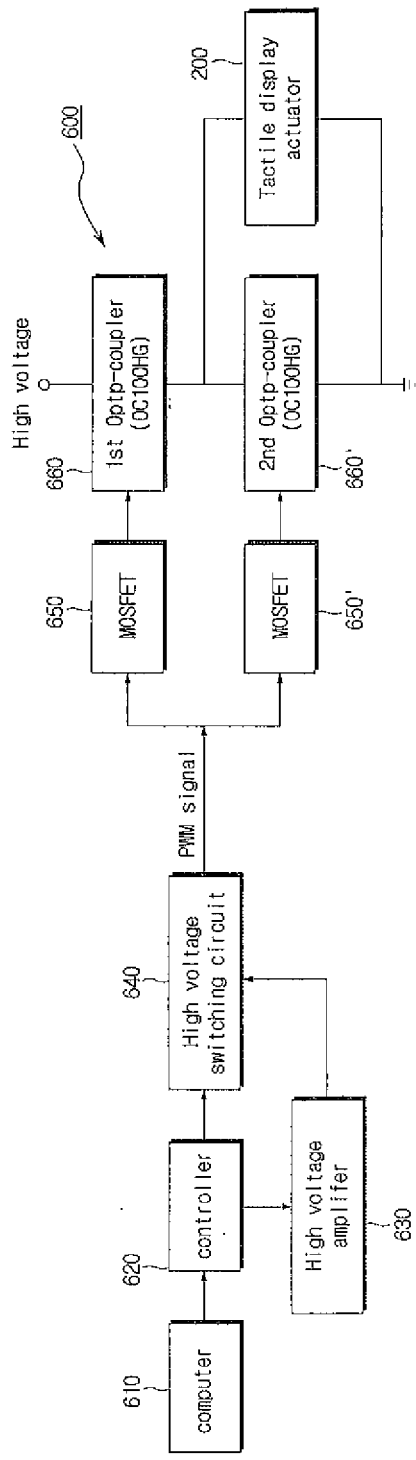
FIG. 7 is a schematic block diagram of a tactile actuating circuit according to an exemplary embodiment of the present invention.

FIG. 7 schematically shows a configuration of a tactile actuating circuit 600 connected to the second electrode 220 of the actuating point 210' formed on the tactile actuating substrate 200. The tactile actuating circuit 600 includes a controller 620 to receive a command from a computer 610, a high voltage amplifier 630 to be controlled by the controller 620 driven in response to the command of the computer 610, and a switching circuit 640 to output a pulse width modulation (PWM) signal by switching a high voltage output from the high voltage amplifier 630.

Further, the PWM signal output from the switching circuit 640 is branched into a first switching device 650 and a second switching device 650', and the first/second switching devices 650 and 650' are connected to a first opto-coupler 660 and a second opto-coupler 660', respectively. The first/second opto-couplers 660, 660' are connected in series and a driving voltage is applied to opposite ends thereof. In this embodiment, the respective second electrode 220 formed on the actuating point 210' of the tactile actuator substrate 200 are connected to the opposite ends of the second opto-coupler 660'. In this tactile actuating circuit 600, driving combination of the first/second opto-couplers 660, 660' controls operation of the actuating point 210'. In more detail, if the first/second opto-couplers 660, 660' are all turned off, the actuating point 210' is not in an operating state. If one of the first/second opto-couplers 660, 660' is turned on, the actuating point 210' is in an operating state, in which the actuating point 210' becomes activated when only the first opto-coupler 660 is turned on but becomes inactivated when only the second opto-couple 660' is turned on. In this embodiment, each of the first/second switching devices 650, 650' may be achieved by a metal oxide semiconductor field effect transistor (MOSFET).

Further, since the fundamental structure of the tactile actuator substrate 200 is approximately the same as the tactile sensor substrate 100, it is also similar that not only all elements constituting the tactile actuator substrate 200 are made of a conformable material but also there are many advantages on a fabricating process. Thus, repetitive descriptions will be avoided since the detailed descriptions of the tactile actuator substrate 200 are the same as those of the tactile sensor substrate 100.

With the above structure, the tactile sensor substrate 100 and the tactile actuator substrate 200 are coupled to each other by the medium of an insulating layer 300. The insulating layer 300 insulates the first electrode 120 formed on the tactile sensor substrate 100 from the second electrode 220 formed on the tactile actuator substrate 200, in which the tactile sensor substrate 100 and the tactile actuator substrate 200 are in close contact with and coupled to each other. Further, there is no limit to a material for the insulating layer 300 as long as it can have insulating properties and conformability. If the material for the insulating layer 300 has adhesion in addition to the insulating properties and the conformability, the tactile sensor substrate 100 and the tactile actuator substrate 200 can be more easily coupled.

Also, the insulating layer 300 is provided as a transparent material like the first and second electrodes 120 and 220, so that the whole active skin in this embodiment can be transparent. The transparent insulating layer 300 in this embodiment may include polyurethane lightweight and excellent in flexibility, but not limited thereto.

Accordingly, the active skin formed by a transparent material in this exemplary embodiment can not only approximately imitate a human's skin as described above, but also be used in many applications provided with a display such as a mobile phone, a tablet personal computer (PC), etc.

Further, in the case that both the sensing point 110' and the actuating point 210' have the embossed structure protruding upwardly on the substrate, the sensing embossment 110' and the actuating embossment 210' may be arranged to overlap each other leaving the insulating layer 300 therebetween. This arrangement is shown in FIGS. 2 and 3.

In the meantime, the tactile sensor substrate 100 and the tactile actuator substrate 200 coupled to each other leaving the insulating layer 300 therebetween may be vertically positioned variously in any combination. That is, the tactile sensor substrate 100 may be positioned on the top, or the tactile actuator substrate 200 may be positioned on the top. This combination may be determined depending on which one of two functions, i.e., the tactile sensing and the tactile display of the tactile interface will be more effectively materialized. While the substrate positioned below is attached to some object (e.g., a human's skin or a robot's surface), the substrate positioned above is exposed to the outside. Hence, the function of the substrate exposed to the outside will be more effectively realized.

Further, in the active skin 10 according to an exemplary embodiment, which includes the tactile sensor substrate 100, the tactile actuator substrate 200 and the insulating layer 300, at least one of two exposed external surfaces of the tactile sensor substrate 100 and the tactile actuator substrate 200 may be provided with a protecting film 400. This is to protect the surface of the tactile sensor substrate 100 and/or the tactile actuator substrate 200, particularly, the electrode 120, 220 formed on the surface of the substrate. There is no limit to a material for the protecting film 400, but it is preferable that the material for the protecting film 400 has insulating properties for preventing a leakage of an electric current applied to the electrode 120, 220 and conformability for keeping the conformability of the conformable active skin 10.

As described above, an active skin according to an exemplary embodiment of the present invention provides technology for achieving an interactive tactile interface since a tactile sensor and a tactile actuator are integrated to not only feel like a human's skin but also actively move like a muscle, thereby completing an interface of input and output through only "Response by Touch."

Also, an active skin according to an exemplary embodiment of the present invention not only has conformability applicable to a human's skin or various opposite objects' surfaces, but is also easy to simplify its fabricating process and to enlarge the interface, thereby enhancing practicality.

Further, an active skin according to an exemplary embodiment of the present invention uses a transparent electrode to approximately imitate a human's skin.

Furthermore, an active skin according to an exemplary embodiment of the present invention uses a transparent material for an insulating layer as well as a transparent electrode, thereby making a product wholly transparent and having various applications.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An active skin comprising:
a tactile sensor substrate for including a first film formed from a dielectric elastic material and having a plurality of sensing points formed therein to be spaced apart from one another by a predetermined distance, and a pair of first electrodes respectively formed on upper and lower sides of each sensing point, wherein each sensing point is a sensing embossment protruding upwardly from the tactile sensor substrate, the pair of first electrodes having a shape corresponding to that of the sensing point, and the tactile sensor substrate sensing the external force through the sensing points by detecting a change in capacitance between the upper and lower sides of each of the plurality of sensing points;
a tactile actuator substrate including a second film formed of a dielectric elastic material and having a plurality of actuating points formed therein and, spaced apart from one another by a predetermined distance so as to correspond to the plurality of sensing points, and a pair of second electrodes respectively formed on upper and lower sides of each actuating point, wherein each actuating point is an actuating embossment protruding upwardly from the tactile actuator substrate, the second pair of electrodes having a shape corresponding to that of the actuating point, the tactile actuator substrate providing tactility outside through a change in area of each of the plurality of actuating points, wherein the change in area of each of the plurality of actuating points is varied depending on a level of voltage applied to the plurality of actuating points from a voltage source included as a component of the active skin, wherein the voltage is varied depending on the change in capacitance between the upper and lower sides of each of the plurality of sensing points, wherein the voltage is only applied to an area of the second electrode corresponding to an area of the tactile sensor substrate in which the change in capacitance is generated such that only the area of the second electrode corresponding to the sensing point to which external force is transferred provides tactility outside, and wherein the plurality of actuating points protrude upwardly from the second film and maintain a convex hemisphere shape when the change in area is generated; and an insulating layer interposed between the tactile sensor substrate and the tactile actuator substrate and insulating the first electrode and the second electrode from each other.

2. The active skin according to claim 1, wherein the sensing point comprises a sensing embossment protruding upwardly on the tactile sensor substrate, the actuating point comprises an actuating embossment protruding upwardly on the tactile actuator substrate, and the sensing embossment and the actuating embossment are arranged to overlap each other leaving the insulating layer therebetween.

3. The active skin according to claim 1, wherein the dielectric elastic material of the first film or the second film comprises at least one selected from a group consisting of silicon, fluorine elastomer, polyurethane and isoprene.

4. The active skin according to claim 1, wherein the first electrode or the second electrode comprises a flexible electrode comprising at least one selected from a group consisting of carbon, graphite or conductive polymer.

5. The active skin according to claim 1, wherein the first electrode or the second electrode comprises a transparent material.

6. The active skin according to claim 5, wherein the first electrode or the second electrode comprises graphene.

7. The active skin according to claim 1, wherein the insulating layer comprises a transparent material.

8. The active skin according to claim 7, wherein the insulating layer comprises polyurethane.

9. The active skin according to claim 1, wherein at least one of two exposed external surfaces of the tactile sensor substrate and the tactile actuator substrate is provided with a protecting film.

10. The active skin according to claim 1, further comprising a tactile sensing circuit electrically connected to the pair of first electrodes respectively formed on upper and lower sides of the sensing point of the tactile sensor substrate, and a tactile actuating circuit electrically connected to the pair of second electrodes respectively formed on upper and lower sides of the actuating point of the tactile actuator substrate.

11. The active skin according to claim 10, wherein the tactile sensing circuit comprises a voltmeter connected to the first electrode of the sensing point, an analog-digital converter (ADC) converting a voltage of the first electrode measured by the voltmeter into a digital signal, and a computer interfacing with the ADC.

12. The active skin according to claim 10, wherein the tactile actuating circuit comprises a controller receiving a command from a computer, a high voltage amplifier controlled by the controller driven in response to the command from the computer, a switching circuit outputting a pulse width modulation (PWM) signal by switching a high voltage output from the high voltage amplifier, first/second switching devices branched from the switching circuit and respectively receiving the PWM signal, and first/second opto-couplers respectively connected to the first/second switching devices, in which a driving voltage is applied to opposite ends of the first/second opto-coupler and the second electrode of each actuating point is connected to the opposite ends of the second opto-coupler.

13. The active skin according to claim 12, wherein each of the first/second switching devices comprises a metal oxide semiconductor field effect transistor.

* * * * *